(12) United States Patent
Takahashi et al.

(10) Patent No.: US 7,915,090 B2
(45) Date of Patent: Mar. 29, 2011

(54) METHOD FOR MANUFACTURING A SEMICONDUCTOR DEVICE

(75) Inventors: Hiroki Takahashi, Tokushima (JP); Shimpei Sasaoka, Anan (JP)

(73) Assignee: Nichia Corporation, Anan-shi (JP)

( * ) Notice: Subject to any disclaimer, the term of this patent is extended or adjusted under 35 U.S.C. 154(b) by 650 days.

(21) Appl. No.: 12/045,919

(22) Filed: Mar. 11, 2008

(65) Prior Publication Data

US 2008/0233678 A1    Sep. 25, 2008

(30) Foreign Application Priority Data

Mar. 20, 2007  (JP) ................ 2007-073141

(51) Int. Cl.
 *H01L 21/00* (2006.01)
(52) U.S. Cl. ........... 438/127; 438/112; 257/E21.502
(58) Field of Classification Search .......... 438/110–114, 438/127, 462
See application file for complete search history.

(56) References Cited

FOREIGN PATENT DOCUMENTS

| JP | H07-211843 A | 8/1995 |
|---|---|---|
| JP | 2000-196000 A | 7/2000 |
| JP | 2000-277809 A | 10/2000 |
| JP | 2000-353825 | 12/2000 |
| JP | 2001-223285 A | 8/2001 |
| JP | 2004-363171 A | 12/2004 |
| JP | 2006-229055 | 8/2006 |

*Primary Examiner* — David A Zarneke
(74) *Attorney, Agent, or Firm* — Global IP Counselors, LLP

(57) ABSTRACT

A method for manufacturing a semiconductor device having a substrate on which conductor wiring is disposed, electrodes provided to the conductor wiring, a semiconductor element connected to the electrodes, and a sealing member that covers the semiconductor element, comprises; mounting a plurality of semiconductor elements on the substrate in the X-axial direction and the Y-axial direction, forming marks in the X-axial direction, supplying the sealing material onto the substrate to continuously-covering the plurality of semiconductor elements arranged in the X-axial direction along the marks, dicing the sealing member and the substrate in the Y-axial direction to form cut planes of the sealing member and the substrate in substantially one plane and being a pair of cut planes opposite one another.

9 Claims, 3 Drawing Sheets

US 7,915,090 B2

METHOD FOR MANUFACTURING A SEMICONDUCTOR DEVICE

BACKGROUND OF THE INVENTION

1. Field of the Invention

The present invention relates to a method for manufacturing a semiconductor device, and more particularly to a method for manufacturing a semiconductor device utilizing a mark.

2. Background Information

Semiconductor devices in which semiconductor elements are mounted on a substrate and covered with a sealing resin have been developed in a variety of configurations in recent years. With these semiconductor devices, the semiconductor elements themselves have high functionality, and the light emitting elements in particular have high output and brightness, so there is a need for smaller size and higher performance.

With this type of semiconductor device, marks and so forth for checking resin misalignment are utilized to prevent the resin misalignment that occurs when the size of the device is reduced and a semiconductor element is sealed with a resin material (for example, see Japanese Laid-open Patent Application No. H7-211843).

There have also been attempts at imparting an anchoring effect to a sealing resin by providing resin pour holes in the sealing resin covered region of the substrate (for example, see Japanese Laid-open Patent Application No. 2001-223285) or by tapering the end face of the electrode formed on the substrate surface (for example, see Japanese Laid-open Patent Application No. 2000-277809), in order to prevent problems such as short-circuiting of bonding wires, separation of semiconductor elements or sealing resin, and so forth that are caused by decreased adhesion between the sealing resin and the substrate as the contact surface area decreases between the sealing resin and substrate, etc., that make up a package.

However, the size of semiconductor device continues to be reduced, which makes extremely precise semiconductor device assembly necessary. Also, so far the wire short-circuiting and the separation of semiconductor elements and so forth attributable to the sealing resin that makes up a package have not been sufficiently prevented, and there is an even greater need for higher output and smaller size, and for higher performance and reliability.

SUMMARY OF THE INVENTION

The present invention was conceived in light of the above problems, and it is an object thereof to provide a method for manufacturing a semiconductor device with which so-called line printing is used and marks are utilized in the resin sealing of semiconductor elements, so that the sealing resin is disposed at the proper places precisely and by a simple method, and adhesion is increased between the sealing resin and the substrate, ensuring a smaller size and higher reliability in the semiconductor device.

The present invention provides a method for manufacturing a semiconductor device having a substrate on which conductor wiring is disposed, electrodes provided to the conductor wiring, a semiconductor element connected to the electrodes, and a sealing member that covers the semiconductor element, comprising; mounting a plurality of semiconductor elements on the substrate in the X-axial direction and the Y-axial direction, forming marks in the X-axial direction, supplying the sealing material onto the substrate to continuously-covering the plurality of semiconductor elements arranged in the X-axial direction along the marks, dicing the sealing member and the substrate in the Y-axial direction to form cut planes of the sealing member and the substrate in substantially one plane and being a pair of cut planes opposite one another.

DETAILED DESCRIPTION OF THE PREFERRED EMBODIMENTS

Figure 1:
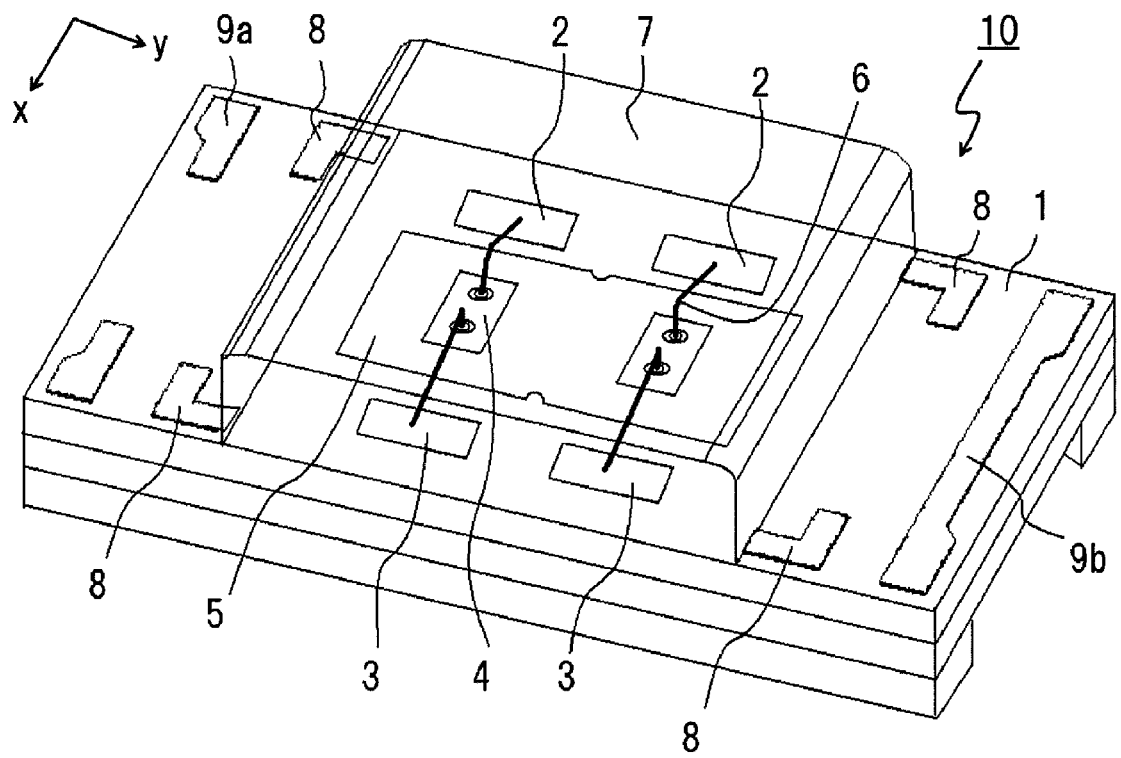
FIG. 1 is an oblique perspective view of a light emitting device formed by the present method for manufacturing the semiconductor device.

The best mode for carrying out the invention will now be described through reference to the drawings, but the mode described below merely exemplifies a semiconductor device manufacturing method for embodying the technological concepts of the present invention, and the present invention is not limited to the semiconductor device manufacturing method discussed below.

Also, this Specification does not limit the members given in the Claims to the members of the embodiments. The sizes, materials, shapes, relative disposition, and so forth of the constituent members discussed in the embodiments are not unless, otherwise specified, intended to limit the scope of the invention to just those, and are merely given as descriptive examples. Furthermore, the size, positional relationships, and so forth of the members illustrated in the various diagrams may be exaggerated in order to make the description more clear. Also, in the following description, members that are the same or have the same properties are given the same names and numbers, and their detailed description may be omitted as appropriate. Furthermore, the various elements that make up the semiconductor device of the present invention may be in a mode such that a plurality of elements are constituted by the same member, and a plurality of elements all serve as a single member, or conversely, the function of a single member may be allocated to a plurality of members.

The inventors examined various methods for manufacturing a semiconductor device in an effort to minimize positional deviation of a sealing member, increase the accuracy of determining positional deviation, and make the determination work more efficient. As a result, the present invention solves the above problems by comprising a step of mounting a plurality of semiconductor elements on a substrate in the X-axial direction and the Y-axial direction, a step of forming marks on the substrate in the X-axial direction, a step of supplying a sealing material in the X-axial direction to the plurality of semiconductor elements on the basis of the marks on the substrate to continuously cover the plurality of semiconductor elements, and a step of dicing the sealing member and the substrate in the Y-axial direction.

The method for manufacturing a semiconductor device pertaining to the present invention is characterized by comprising at least the following steps.

(1) A step of forming marks in at least an X-axial direction, out of the X-axial direction (hereinafter also referred to as the "X direction") and a Y-axial direction (hereinafter also referred to as the "Y direction") that is perpendicular to this X-axial direction, on a main face of a substrate on which conductor wiring is disposed.

(2) A step of arranging a plurality of semiconductor elements in at least the X-axial direction on a main face of the substrate.

(3) A step of continuously supplying a sealing material onto a substrate including a plurality of semiconductor elements arranged in the X-axial direction along the marks in the X-axial direction, while exposing at least part of the marks from the sealing resin.

(4) A step of curing the sealing material continuously disposed over the plurality of semiconductor elements, and thereby forming a sealing member that covers the semiconductor elements.

(5) A step of providing a plurality of dicing lines so as to sandwich at least one of the semiconductor elements in the Y-axial direction, and continuously dicing from the front of the sealing member to the back of the substrate, and thereby forming the cut planes of the sealing member and the substrate in substantially one plane.

(6) A step of comparing the position of the lower end of the sealing member and the position of the marks, for a semiconductor device in which the cut planes are a pair of side faces opposite one another, and thereby determining if there is deviation of the sealing member from a specific location.

The preferred embodiments of a method for manufacturing a semiconductor device of the present invention, in particular a method for manufacturing a light emitting device utilizing a light emitting element as a semiconductor element, will be described below.

The semiconductor device manufacturing method of this mode is a method for manufacturing a semiconductor device that includes a substrate, positive and negative electrodes formed on the substrate, light emitting elements connected to the positive and negative electrodes, and a sealing member that covers the light emitting elements, and in which the end faces of the sealing member and the substrate are in substantially the same plane at a set of side faces that are opposite one another.

First, a substrate for mounting a light emitting element will be described below.

There are no particular restrictions on the substrate as long as it is a substrate that is commonly used in the manufacture of this type of light emitting device, but usually it is an insulating substrate on whose surface are formed positive and negative electrodes.

There are no particular restrictions on the insulating substrate as long as it is made of a material having an insulation and suitable mechanical strength, but examples include BT resin, glass epoxy, and ceramic. Epoxy resin sheets or ceramic sheets may also be stuck together in a multilayer configuration, respectively. A ceramic substrate is particularly favorable because of its excellent heat resistance. A ceramic substrate with relatively few layers (for example, two to four layers) is even better because it will undergo less warping, allowing good flatness to be attained, and solder cracking resistance can be obtained. It is preferable for the substrate surface to be substantially flat. The term "substantially flat" as used here means that no recesses are purposely formed for the mounting of light emitting elements, but some bumpiness is permissible, comparable to the thickness of the metal material or the like used to form the electrode or light emitting element mounting region (discussed below). From the standpoint of ensuring adhesion to the sealing resin, the surface of the substrate is preferably rough. For example, the surface roughness is preferably about 2 μm (actual-measured). The surface roughness (Ra) here is expressed by the arithmetic mean in a randomly selected region on the substrate surface, and is defined in JIS B 0601 (1994), for example. If the sealing resin and the substrate are bonded together in this way, there will be no need to form recesses for disposing sealing resin or light emitting elements on the substrate surface, and light can be taken out from the light emitting elements from about 180 degrees, so light takeoff efficiency can be improved.

The positive and negative electrodes formed on the substrate can usually be formed by a metal or an alloy as well as a single or multi layer or the like whose main component is copper, silver, or the like. These electrodes can be formed by vapor deposition or sputtering and photolithography, or by printing, etc., but are preferably formed so that they penetrate through the substrate and are exposed on the front and back of the substrate by what is called conductor wiring (such as the electrode material). With this approach, there is no cutting of the electrode portion when the substrate is diced, so no burrs or the like are produced, and machining can be carried out more easily and precisely. Also, there is no need to route the electrodes around, so the semiconductor device can be more compact.

In addition to the positive and negative electrodes, the substrate may also have a region formed of the same material as the electrodes, for mounting the light emitting elements. With this region used for mounting (hereinafter referred to as "mounting region"), the electrode material preferably penetrates through the substrate and is exposed on the back side. This improves heat dissipation.

The positive and negative electrodes are preferably formed on the substrate so as to be parallel to each other in the X-direction. Also, if a region for mounting light emitting elements is separately formed on the substrate, it is preferably formed so that the positive and negative electrodes sandwich this region and are parallel to each other in the X-direction. This allows the wire bonding for connecting the positive and negative electrodes of the substrate with the electrodes in the light emitting elements to be performed in the X-direction when mounting the light emitting elements (discussed below).

Also, the manufacturing method of the present invention includes a step of mounting a plurality of light emitting elements in the X- and Y-directions on the substrate.

The light emitting elements are generally semiconductor light emitting elements, especially, any semiconductor light emitting elements may be used so long as they are elements called light emitting diodes. For example, it includes a laminated structure that contains an active layer above a substrate, which is made of nitride semiconductors such as InN, AlN, GaN, InGaN, AlGaN, and InGaAlN, and compound semiconductors of a group III-V elements, II-VI elements, and the like. The structures of semiconductor includes homostructures having MIS junctions, PIN junctions, or PN junctions or the like, heterostructures, and double heterostructures. Furthermore, a multilayer laminate structure or an ultra lattice structure are also acceptable, as are a single quantum well structure or a multiquantum well structure laminated as a thin film which generates quantum effects. The active layer may contain a donor impurity such as Si, Ge, or the like, and acceptor impurity such as An, Mg, or the like. A wave length of the obtained light emitting element may be changed from ultraviolet to red region depending on a material of the semiconductor, a mixed crystal rate, indium content of the active layer, kind of the impurity doped in the active layer.

The light emitting elements are mounted on the positive or negative electrode, or the mounting region as separately prepared, and a joining material is usually used for this purpose. Die bonding may be performed using, for instance, a resin such as epoxy resin, silicone, a solder such as eutectic Au—Sn, a brazing material such as a low-melting point metal, or a conductive paste made of silver, gold, palladium, or the like.

Electrodes formed for a light emitting element connect to the positive and negative electrodes formed on the substrate. When a light emitting element has positive and negative electrodes on the same side, the positive electrode on the substrate and the positive electrode of the light emitting element, and the negative electrode on the substrate and the negative electrode of the light emitting element, are preferably wire bonded so that the wires extend substantially in the X-direction. When the positive and negative electrodes of a light emitting element are provided on the top side and rear side of the light emitting element, usually the electrode on the rear side is connected to one of the electrodes on the substrate by placing the light emitting element on one of the electrodes on the substrate and wire bonding. It is preferable if at least the electrode on the top side and the other electrode on the substrate are wire bonded so that the wire extends substantially in the X-direction. The phrase "the wire extends substantially in the X-direction" here means that if the X-direction is 0°, an inclination of about ±10° is permissible.

Since this results in the wire extending in the direction of printing along the X-axis of the sealing resin (discussed below), wire fatigue can be prevented, and the reliability of electrical connections increased, without subjecting the wire to stress (load) during the printing of the sealing resin. This also prevents voids from forming in the sealing resin around the wire. Furthermore, by providing wire bonding in one direction (that is, the X-direction), the printing width of the sealing resin in the X-direction (discussed below) can be reduced, so the sealing member can be made smaller, the brightness of the semiconductor device, and particularly the light emitting device, can be increased, and higher luminance can be achieved.

A plurality of light emitting elements, rather than just one, may be mounted in the light emitting device. In this case, a plurality of light emitting elements that emit light of the same color may be combined, or a plurality of light emitting elements that emit light of different colors may be combined corresponding to RBG. When a plurality of light emitting devices are installed, a plurality of light emitting elements may parallel in the X-direction or the Y-direction, or both, as long as the layout allows wire bonding so that the wire extends substantially in the X-direction as discussed above. The light emitting elements in this case may be electrically connected to the electrodes on the substrate so that the connection relationship is parallel, serial, etc.

Also, protective elements may be mounted in the light emitting device of the present invention. Just one protective element or two or more may be used. The protective element may be disposed on the front side and/or on the rear side of the substrate. The substrate may be specially provided with a recess to hold the protective element so that the protective element does not block the light from the light emitting elements. There are no particular restrictions on the protective element, and any known type that is mounted in light emitting devices may be used. Examples include elements that protect against overheating, over-voltage, over-current, static electricity, and circuit protection elements. Specific examples include diodes such as Zener diode and a transistor.

Further, with the manufacturing method of the present invention, marks are formed in the X-direction on the substrate.

These marks are preferably formed at a specific spacing in the X-direction, according to a known method, or by a known method such as printing along the line direction (hereinafter referred to as "line printing"). When the light emitting elements are mounted in the X- and Y-directions on the substrate, the line printing in the X-direction is preferably formed in a plurality of rows in the Y-direction. There are no particular restrictions on the material used for the marks, but they can be formed, for example, by ink that is ordinarily used in this field, the above-mentioned electrode material, a paste of tungsten or another such high-melting point metal, or the like.

Just one mark may be formed near the end of the sealing member (discussed below) in the Y-direction within a single light emitting device, or two may be formed, for example, at opposite corners or on the same line in the X-direction, or a total of four may be formed at two sets of locations in opposite corners.

There are no particular restrictions on the shape of the marks, which can be suitably adjusted according to the size of the light emitting elements, the spacing between the light emitting elements on the substrate, the size of the light emitting device to be formed, and so forth, but the marks preferably have a specific width extending at least in the X-direction, and even more preferably have a specific width in the Y-direction as well. For instance, it is favorable for these marks to have a length in the X-direction of about 0.25 mm and a width in the Y-direction of about 0.10 mm. Therefore, it is good for the marks to have, for example, a polygonal shape that extends in the XY directions, namely, a tetrahedral shape or a right-angle or substantially right-angle hook shape, etc., corresponding to the peripheral edge of the sealing member, the light emitting element, and the light emitting device. Also, the marks are favorably disposed in the X-direction at a specific pitch including, for example, a pitch corresponding to the dicing width discussed below, or a pitch corresponding to the size of the semiconductor device. Forming the marks in this way allows the position of the line printing of the sealing resin to be discerned with good precision in the X-direction in a subsequent step, prevents printing misalignment of the sealing resin, and also ensures precision by checking for positional deviation in just the X-direction, which means that the work is more efficient.

It is also possible to control the substrate dicing position in a subsequent step by utilizing the spacing between marks in the X-direction.

These marks may be formed at any stage prior to the step of line printing the sealing resin (discussed below), such as before or after the amounting of the light emitting elements on the substrate, before the formation of the electrodes on the substrate, or simultaneously with the formation of the substrate.

Also, in the manufacturing method of the present invention, a plurality of light emitting elements are covered with the sealing member by line printing in the X-direction on the basis of the marks on the substrate.

There are no particular restrictions on the resin making us the sealing member as long as it has a translucent property, but examples include such known materials as one or more resins of polyolefin resin, polycarbonate resin, polystyrene resin, epoxy resin, acrylic resin, acrylate resin, methacrylic resin (PMMA or the like), urethane resin, polyamide resin, polynorbornene resin, fluoridated resin, silicone resin, modified silicone resin, modified epoxy resin, as well as liquid crystal polymer or the like. Among these, epoxy resin, silicone resin, modified silicone resin, urethane resin, oxetane resin or the like are suitable. The phrase "translucent" here means that it can transmit in just enough a light to observe light through the sealing member. The materials may contain an additional substance such as a phosphor, pigment, filler, diffuser or the like. There are no particular restrictions on the additional substance, but examples include known phosphor, pigment, filler, diffuser or the like described in, for example, WO2006/38502, Japanese Laid-open Patent Application No. 2006-229055.

A material containing such the resin is used to form the sealing member by line printing. Here, the pre-curing viscosity of the sealing member is preferably adjusted to from 50 to 500 Pa·s, for example. The term "viscosity" here means the viscosity as measured at normal temperature with a conical plate type of rotary viscometer. Adjusting the viscosity to within the above range allows the load on wires, etc., to be minimized when line printing is performed, and prevents unintended resin sag, etc., allowing the sealing member to be formed in the proper shape.

Line printing can be performed by any procedure that is known in this field, but a material containing the resin must be printed at the proper locations in the X-direction on the basis of the marks formed in the X-direction. This easily and effectively prevents printing misalignment of the sealing member, and affords precise printing. Also, unlike with coating and spray methods, the shape of the sealing member can be adjusted as desired by adjusting the viscosity of the material containing the resin, the printing rate, and other such factors, so the resin material is not wasted, the amount of light absorbed by the resin is reduced, and the light takeoff efficiency is further enhanced.

Also, as discussed above, when wire bonding is performed in the X-direction, stress on the wires can be reduced and wire fatigue can be prevented, which allows a semiconductor device with higher reliability to be formed, and the flow of resin can also be made smoother, the admixture of voids near the wires can be reduced, and the light takeoff efficiency can be enhanced.

The sealing member is preferably formed in a shape that will entirely cover the light emitting elements, the positive and negative electrodes, and the wires.

With the manufacturing method of the present invention, the substrate is diced in the X-direction. The dicing can be performed by a known method using a dicing blade or the like. Furthermore, with the manufacturing method of the present invention, the substrate is diced in the Y-direction. This dicing can be carried out simultaneously with the dicing in the X direction. Either of these dicing operations may be performed first. Also, the spacing between the marks can be utilized to perform the dicing at the proper locations.

As a result, a light emitting device in which the end faces of the sealing member and the substrate are in substantially one plane can be formed at one set of side faces opposite one another. Adopting a shape such as this makes it possible to minimize extra space between the sealing member and the substrate at the side faces of the light emitting device, and to obtain a light emitting device that is even more compact.

The light emitting device manufacturing method of the present invention will now be described in specific terms through reference to the drawings.

Embodiment 1

The light emitting device formed in this Embodiment 1, as shown in FIG. 1, is such that a negative electrode 2 and a positive electrode 3 are formed a specific distance apart on an insulating substrate 1 whose upper face has a flat, substantially cuboid shape. A mounting region 5 for mounting light emitting elements 4 is disposed in between the negative electrode 2 and the positive electrode 3, and the negative electrode 2, the mounting region 5, and the positive electrode 3 are disposed in that order in the X-direction. The negative electrode 2 and the positive electrode 3 are connected mounting electrodes (not shown) formed on the back side of the insulating substrate 1 via through-holes (not shown). The light emitting elements 4, each of which is equipped with a pair of positive and negative electrodes on the semiconductor face side, are mounted in the mounting region 5, the negative electrode of each light emitting element 4 is connected by a wire 6 to the negative electrode 2 on the insulating substrate 1, and the positive electrode of each light emitting element 4 is connected by a wire 6 to the positive electrode 3 on the insulating substrate 1. The wires 6 are all connected so that they extend substantially in the X-direction.

Right-angle hook-shaped marks 8 are provided at specific locations on the substrate 1, and a sealing member 7 is formed at a specific location with respect to the marks 8 so as to cover the light emitting elements 4, the negative electrode 2, the positive electrode 3, and the wires 6.

The sealing member 7 is cut along substantially the same planes as the end faces of the substrate 1 on both sides.

Further, dicing misalignment marks 9a and 9b are formed outside of the marks 8 on the substrate 1. Of these, one or the other can be utilized as a polarity indicating mark. There are no particular restrictions on the shape of these marks 9a and 9b, and they can be formed in any number and shape desired near the ends of the light emitting device 10 in the Y-direction.

The negative electrode 2 and the positive electrode 3 are electrically connected to the electrodes formed on the back side via through-holes from the negative electrode 2 and the positive electrode 3 or via internal wiring in the substrate.

This light emitting device can be manufactured as follows.

Usually, up until the formation of the sealing member, a package assembly in which a plurality of light emitting devices is grouped is used so that a plurality of light emitting devices can be manufactured all at once.

Figure 2:
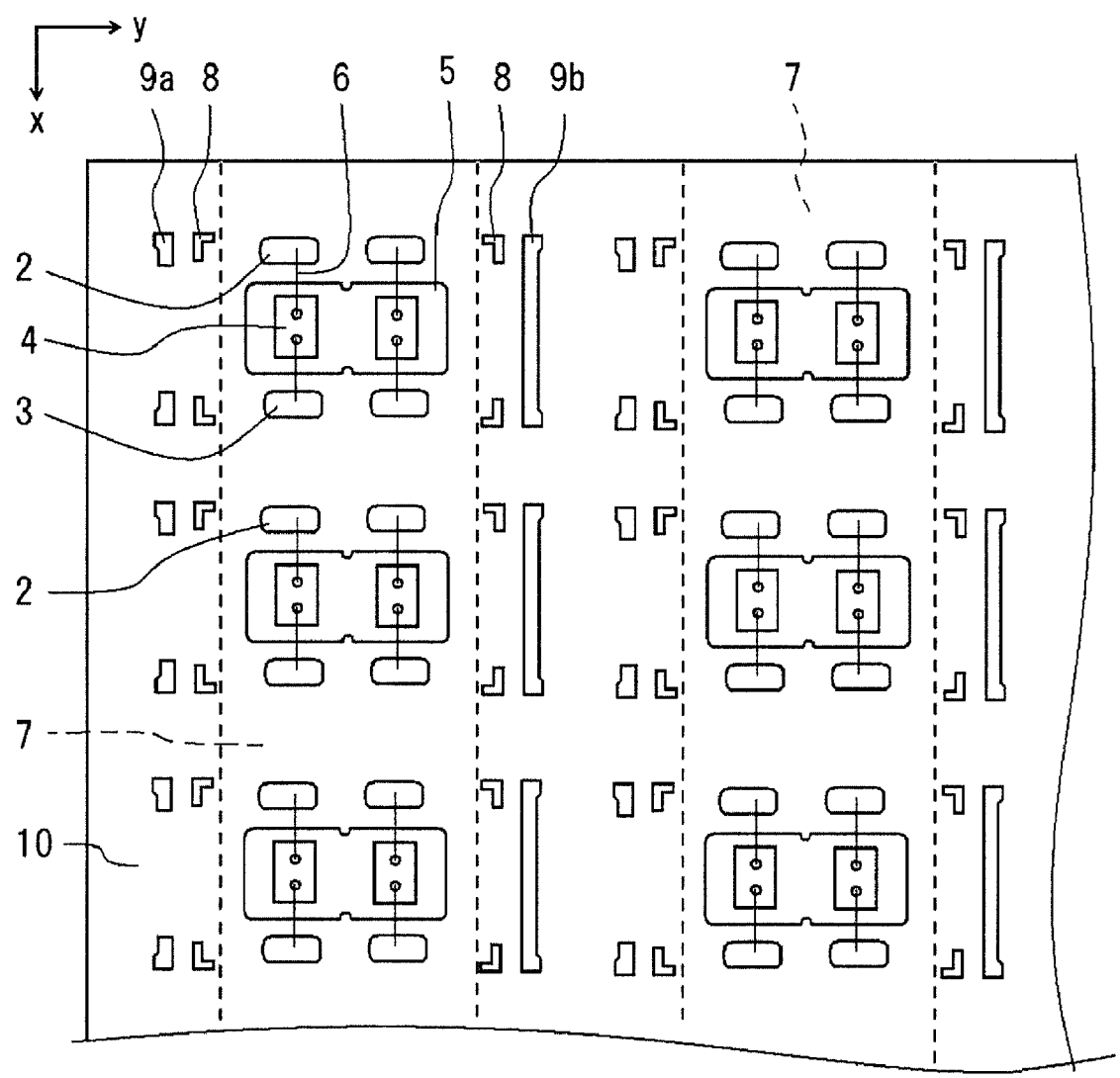
FIG. 2 is a plane view describing the method for manufacturing of the semiconductor device.

With this package assembly, as shown in FIG. 2, the mounting regions 5 for each of the light emitting elements 4 are laid out in a matrix on an insulating substrate 1 with a large surface area. The negative electrode 2 and the positive electrode 3 corresponding to each of the light emitting elements 4 are formed in the X-direction so as to flank the mounting region of each light emitting element 4 from both sides. The insulating substrate 1 is composed, for example, of a ceramic laminate with a total thickness of from 0.1 to 0.2 mm, and a plurality of through-holes (not shown) that pass through each layer in the thickness direction are formed so as to be linked. The negative electrode 2 and the positive electrode 3 are connected to mounting electrodes formed on the back of the insulating substrate 1. The mounting regions 5 are also partially exposed on the back side.

The right-angle hook-shaped marks 8, which are 250 μm long in the X-direction, 250 μm long in the Y-direction, and 100 μm wide, are formed at a pitch of 1.5 mm in the X-direction and 1.5 mm in the Y direction on this substrate 1. These marks 8 are formed, for example, by printing with a tungsten paste in a thickness of about 10 μm.

Then, the light emitting elements 4 are die-bonded in the mounting regions 5 on the substrate 1, and gold wires 6 with a diameter of 25 μm, for example are used to wire-bond the negative and positive electrodes of the light emitting elements with the negative electrode 2 and the positive electrode 3 on the substrate 1. The wire bonding here is adjusted so that the direction in which the wires 6 extend from the negative electrode 2 on the substrate 1 to the negative electrode of the light emitting element is substantially the X-direction.

The sealing member 7 is then formed. The resin material that makes up the sealing member 7 is, for example, the product of mixing a YAG fluorescent substance in a specific proportion with an epoxy resin, and is adjusted to a viscosity of 300 Pa·sec. This resin material is printed in a specific width at a suitable location by line printing, moving the stage in the X-direction on the basis of the marks 8. The sealing member 7 here is preferably formed so as to completely cover all of the light emitting elements 4, the negative electrodes 2, the positive electrodes 3, and the wires 6.

After this, the substrate 1 is put in a convection oven, and the sealing member 7 is cured by being heated for 4 hours at 150° C., for example. The substrate 1 is then diced in two directions (the X-direction and the Y-direction), and light emitting devices are cut out in a specific width and length to obtain completed light emitting devices.

Thus, with the method for manufacturing a light emitting device in this embodiment, using the marks 8 as discussed above allows the printing locations to be controlled more precisely, and prevents positional misalignment of the sealing member 7. Also, using this line printing method allows linked sealing members 7 in the form of lines in the X direction to be formed as thin films, and many light emitting devices can be formed simultaneously, by an extremely simple method, in a short time, and in a stable, compact shape, in other words, the sealing resin can be disposed at the proper places precisely and by a simple method, and adhesion is increased between the sealing resin and the substrate.

In particular, since the sealing member 7 can be formed as a thin film, the absorption of light from the light emitting elements by extra sealing resin material can be prevented, and this increases the light takeoff efficiency. Also, if a fluorescent substance is contained, this will also lead to a reduction in color unevenness.

Furthermore, since the wires 6 of the wire bonding extend in the X-direction, and the line printing is performed in the X-direction, the wires are subjected to far less load from a squeegee, short-circuiting and so forth of the wires 6 are prevented, and light emitting devices of high reliability can be manufactured at a high yield.

Embodiment 2

Figure 3:
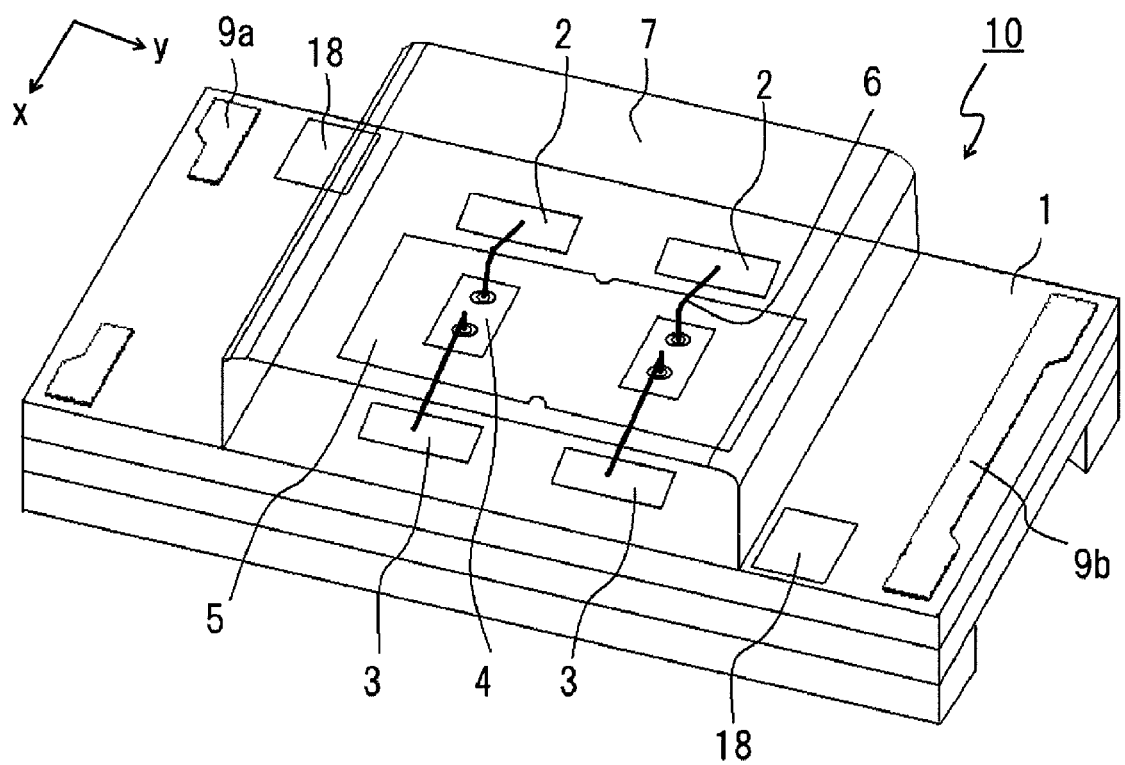
FIG. 3 is an oblique perspective view of anther light emitting device formed by the present method for manufacturing the semiconductor device.

This Embodiment 2 is substantially the same as Embodiment 1, except that as shown in FIG. 3, the marks 18 are formed near two diagonally opposite corners, and the shape thereof is tetrahedral, with a length in the X-direction of 100 μm and a length in the Y-direction of 100 μm.

The method for manufacturing the light emitting device of the present invention can be utilized as a various device, of the type in which light is emitted from a side face toward a side face of the package, by mounting a light emitting diode chip, for example, and can be used not only in illumination devices used in image readers such as facsimile machines, copiers, and hand scanners, but also in various other illumination devices such as illumination light sources, backlight light sources for LED displays, portable telephones, and so forth, signaling devices, lighting switches, automotive brake lamps, various kinds of sensor, various kinds of indicator, and so on with a simple, easy and higher precision.

This application claims priority to Japanese Patent Application No. 2007-73141. The entire disclosure of Japanese Patent Application No. 2007-73141 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A method for manufacturing a semiconductor device having a substrate on which conductor wiring is disposed, electrodes provided to the conductor wiring, a semiconductor element connected to the electrodes, and a sealing member that covers the semiconductor element, comprising;
   mounting a plurality of semiconductor elements on the substrate in the X-axial direction and the Y-axial direction,
   forming marks in the X-axial direction,
   supplying the sealing material onto the substrate to continuously-covering the plurality of semiconductor elements arranged in the X-axial direction along the marks,
   dicing the sealing member and the substrate in the Y-axial direction to form cut planes of the sealing member and the substrate in substantially one plane and being a pair of cut planes opposite one another.

2. The method of claim 1, further comprising a step of dicing the substrate in the X-axial direction along the marks.

3. The method of claim 1, wherein the marks are formed in a plurality of rows in the X-direction, and the semiconductor element and the sealing member are positioned between a pair of rows of the marks.

4. The method of claim 1, wherein mounting the semiconductor elements is performed after formation of the marks.

5. The method of claim 1, wherein the mark has a shape that extends in the X directions.

6. The method of claim 1, wherein the mark has a polygonal shape that extends in the X and Y directions.

7. The method of claim 1, further comprising;
   forming the substrate on which positive and negative electrodes of the conductor wiring is disposed in the X-axial direction on a mounting region of the semiconductor element, and
   wire-bonding the electrode of the semiconductor element and the electrode of the substrate using with a conductor wire;
   the wire bonding is performed so that the conductor wire extends substantially in the X-direction.

8. The method of claim 1, wherein the supplying the sealing material is performed by utilizing line printing.

9. The method of claim 1, wherein the formation of the marks is performed simultaneously with the formation of the substrate.

* * * * *